(12) United States Patent
Terhune, IV

(10) Patent No.: US 8,747,120 B2
(45) Date of Patent: Jun. 10, 2014

(54) ELECTRICAL CONNECTOR INCORPORATED WITH PICK-AND-PLACE PICK-UP CAP

(75) Inventor: Albert Harvey Terhune, IV, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 178 days.

(21) Appl. No.: 13/315,289

(22) Filed: Dec. 9, 2011

(65) Prior Publication Data

US 2013/0149886 A1    Jun. 13, 2013

(51) Int. Cl.
*H01R 13/60* (2006.01)
*H05K 7/10* (2006.01)
*H01R 13/627* (2006.01)

(52) U.S. Cl.
CPC ............. *H05K 7/1053* (2013.01); *Y10S 438/94* (2013.01); *H01R 13/627* (2013.01); *Y10S 439/94* (2013.01)
USPC .............................. 439/41; 439/940; 438/940

(58) Field of Classification Search
USPC ............................ 439/350, 41, 352, 940, 135
See application file for complete search history.

(56) References Cited

U.S. PATENT DOCUMENTS

| 6,899,553 | B2 * | 5/2005 | Ma et al. ........................ 439/135 |
| 7,083,456 | B2 | 8/2006 | Trout et al. |
| 7,140,890 | B1 * | 11/2006 | Ju .................................. 439/135 |
| 7,530,822 | B2 * | 5/2009 | Liao .............................. 439/135 |
| 7,753,687 | B2 | 7/2010 | Fan |
| 8,137,121 | B2 * | 3/2012 | Dai ............................... 439/135 |

* cited by examiner

*Primary Examiner* — Neil Abrams
*Assistant Examiner* — Travis Chambers
(74) *Attorney, Agent, or Firm* — Wei Te Chung; Ming Chieh Chang

(57) ABSTRACT

An electrical connector for electrically connecting a central processing unit (CPU) comprises an insulating housing having a plurality of terminals received therein and a pick-up cap removably assembled to the insulating housing for carrying and placing the CPU onto the insulating housing. The insulating housing has a plurality of receiving slots sunk from top surfaces of two sidewalls thereof and a plurality of wedge-shaped grooves disposed between the receiving slots on one same sidewall. The pick-up cap defines a plurality of hooks extending therefrom for buckling to the insulating housing. The pick-up cap also defines a plurality of latches corresponding to the receiving slots and a plurality of releasing arms corresponding to the grooves. The latches received in the receiving slots can clasp the CPU to retain the CPU on the pick-up cap and be released the CPU when the releasing arms are pulled outwardly.

19 Claims, 9 Drawing Sheets

ELECTRICAL CONNECTOR INCORPORATED WITH PICK-AND-PLACE PICK-UP CAP

BACKGROUND OF THE INVENTION

1. Field of the Invention

The present invention relates to an electrical connector, and more particularly to an electrical connector incorporated with a pick-and-place pick-up cap in which a CPU can be properly carried by the pick-up cap, and then properly release and dispose the CPU into a cavity of the socket when the pick-up cap engaged with the electrical connector.

2. Description of Related Art

A conventional electrical connector electrically connecting a central processing unit (CPU) to a printed circuit board (PCB) disclosed in U.S. Pat. No. 7,753,687 issued to Fan on Jul. 13, 2010 comprises an insulating housing having a plurality of terminals received therein and a pick-up cap mounted on the insulating housing. The insulating housing has four sidewalls defining a plurality of slots disposed on outer surfaces thereof. The pick-up cap defines a plurality of latches attaching with the slots of the insulating housing to assemble the pick-up cap onto the insulating housing for protecting the terminals before the CPU mounted onto the insulating housing.

When using, the operator need to remove the pick-up cap from the insulating housing and manually pick and place the CPU onto the insulating housing to achieve electrical connection between the electrical connector and the CPU. However, the terminals are easily damaged due to mishandling the CPU during the process of manually placing the CPU onto the insulating housing.

Hence, it is desirable to provide an improved electrical connector to overcome the aforementioned disadvantages.

SUMMARY OF THE INVENTION

Accordingly, an object of the present invention is to provide an electrical connector with a pick-up cap for carrying and placing a central processing unit (CPU) thereto.

According to one aspect of the present invention, an electrical connector for electrically connecting a central processing unit (CPU) to a printed circuit board (PCB) comprises an insulating housing having a plurality of terminals received therein and a pick-up cap removably assembled to the insulating housing. The insulating housing has a plurality of holding slots on outer surfaces of two opposite sidewalls thereof. The pick-up cap has a plurality of hooks extending downwardly from two opposite sides thereof for engaging with the holding slots to mount the pick-up cap onto the insulating housing. The pick-up cap defines a plurality of latches extending downwardly from the other two opposite sides thereof for clasping the CPU.

Other objects, advantages and novel features of the invention will become more apparent from the following detailed description when taken in conjunction with the accompanying drawings, in which:

DETAILED DESCRIPTION OF THE INVENTION

Figure 1:
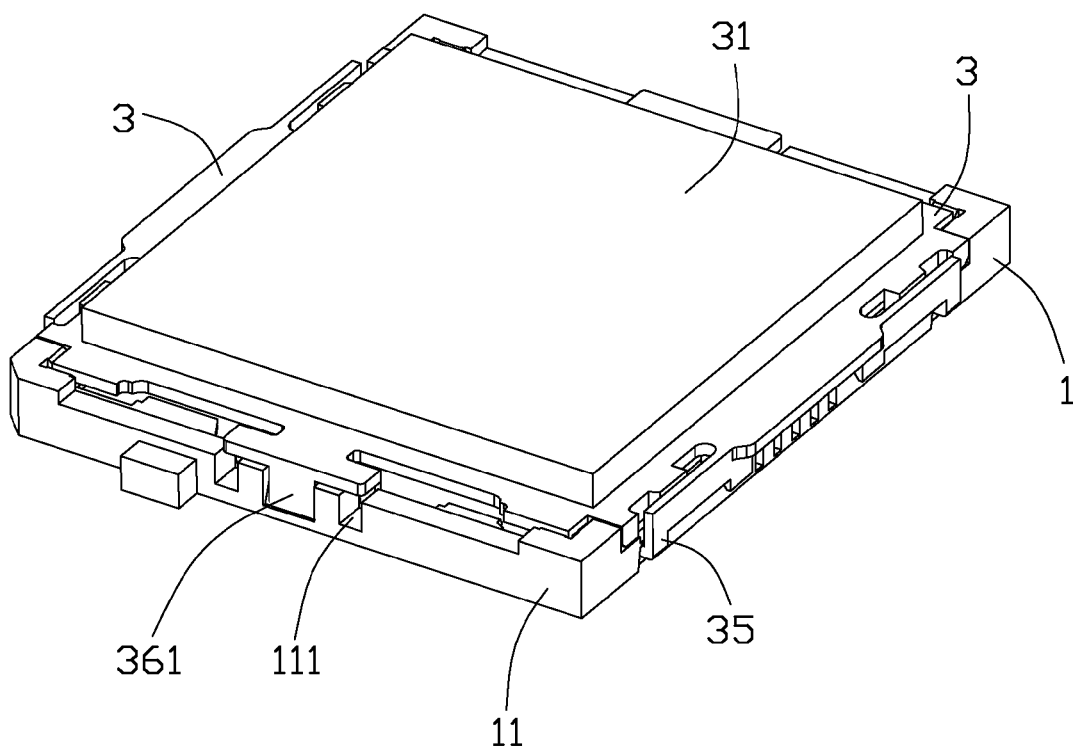
FIG. 1 is a perspective view of an electrical connector and a central processing unit (CPU) in accordance with the embodiment of the present invention.

Reference will now be made to the drawings to describe the present invention in detail.

Referring to FIGS. 1-8, an electrical connector 100 in accordance with a preferred embodiment of present invention is disclosed. The electrical connector 100 used for electrically connecting a central processing unit (CPU) 4 to a printed circuit board (not shown) comprises an insulating housing 1 having a plurality of terminals 2 received therein and a pick-up cap 3 removably assembled to the insulating housing 1 for carrying and placing the CPU 4 onto the insulating housing 1 to achieve electrical connection between the electrical connector 100 and the CPU 4. The CPU 4 has a base plate 40 and a chip 41 extending upwardly from the base plate 40.

Figure 2:
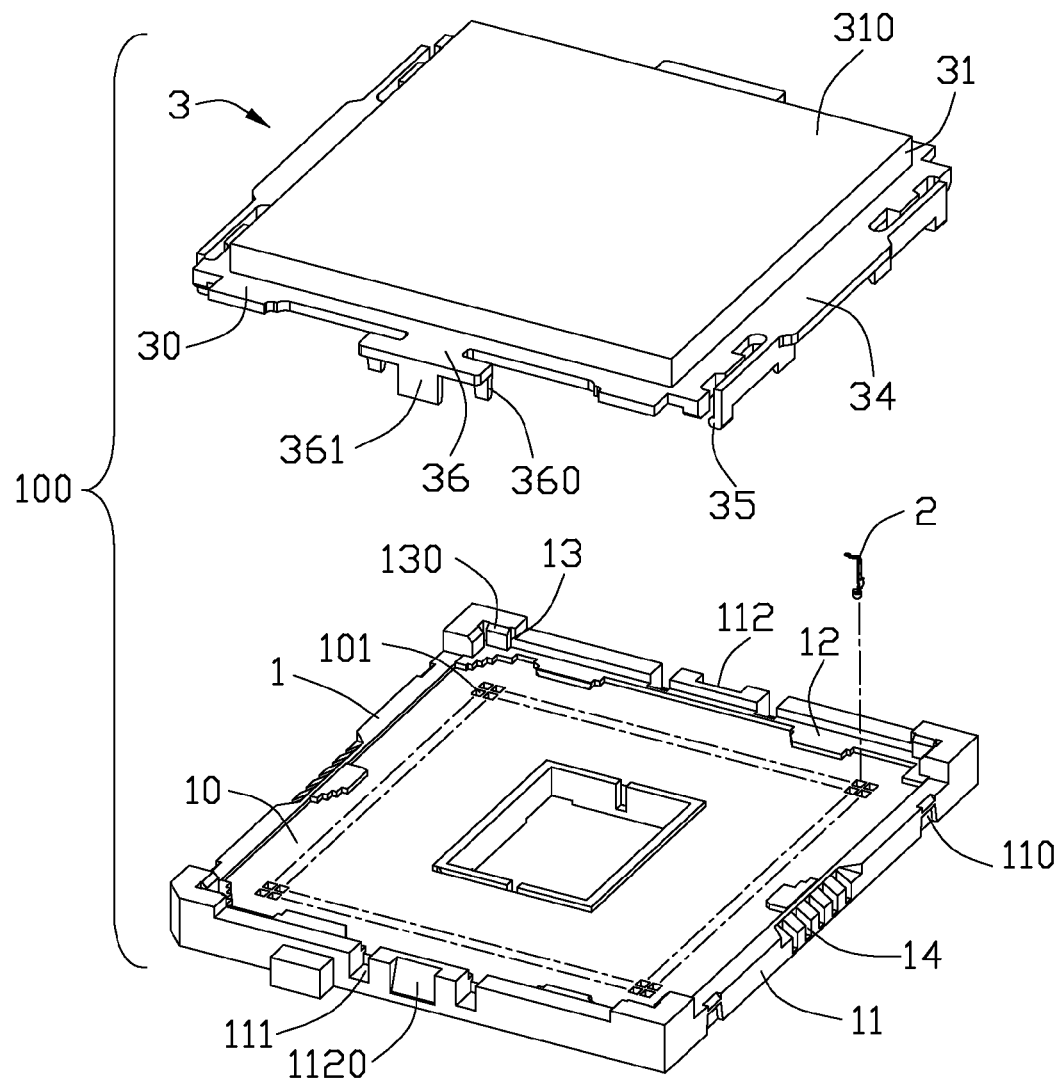
FIG. 2 is an exploded, perspective view of the electrical connector shown in FIG. 1.
Figure 5:
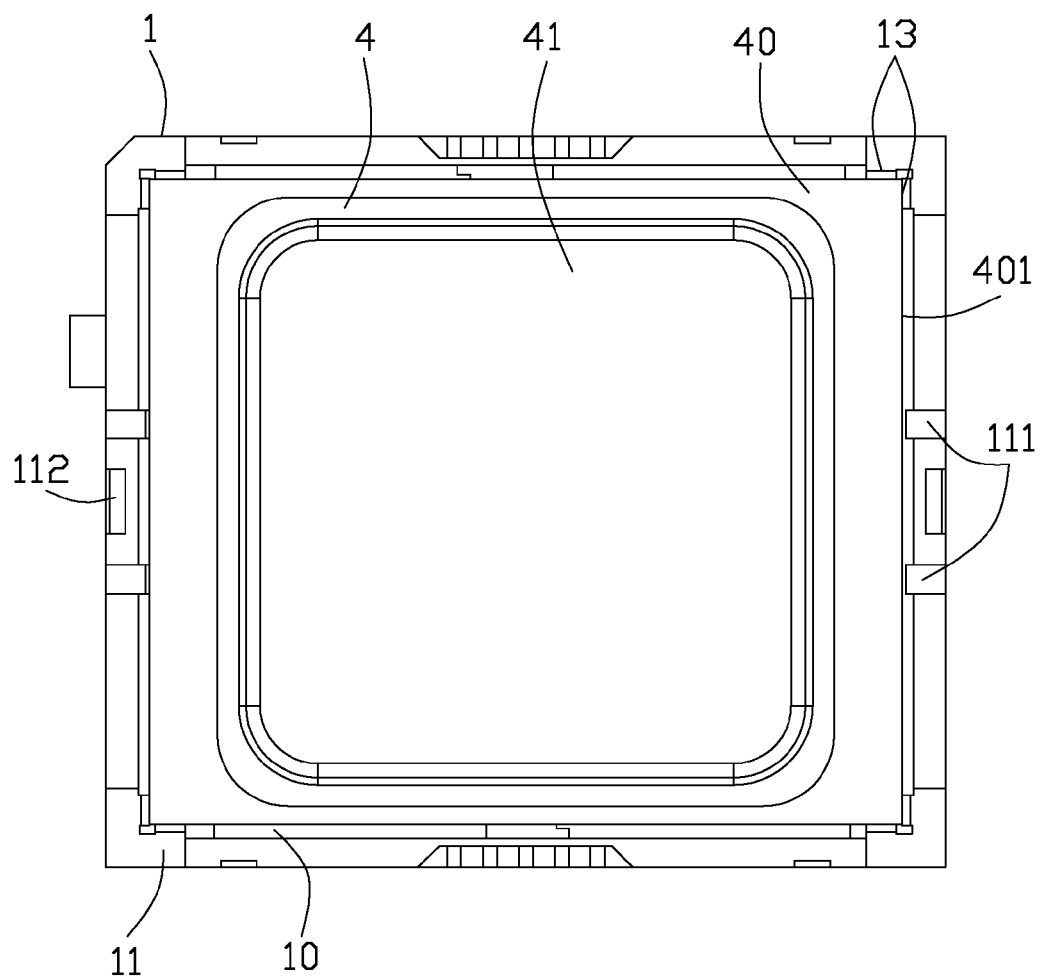
FIG. 5 is a top view of the electrical connector of FIG. 1, showing the pick-up cap is removed from an insulating housing of the electrical connector and the CPU is seated thereon.

Referring to FIGS. 2 and 5, the insulating housing 1 has a main body 10 and four sidewalls 11 around the main body 10. A receiving space 12 is defined by the main body 10 and the sidewalls 11 for receiving the CPU 4. The main body 10 defines a plurality of passageways 101 extending therethrough for receiving the terminals 2. A plurality of datum 13 protrudes from the sidewalls 11 toward the receiving space 12 for engaging with sidewalls 401 of the base plate 40 to position and retain the CPU 4 in the insulating housing 1. Each datum 13 defines an oblique guiding surface 130 for guiding the CPU 4 into the receiving space 12. The insulating housing 1 also defines a plurality of holding slots 110 on outer surfaces of two opposite sidewalls 11 thereof. Two pair of receiving slots 111 each having a rectangular shape are sunk from top surfaces of the other two opposite sidewalls 11, respectively. A pair of ramp arrangements 112 each with an oblique surface 1120 are formed on the sidewalls 11 and each is disposed between two receiving slots 111 located on the same sidewall 11.

Figure 3:
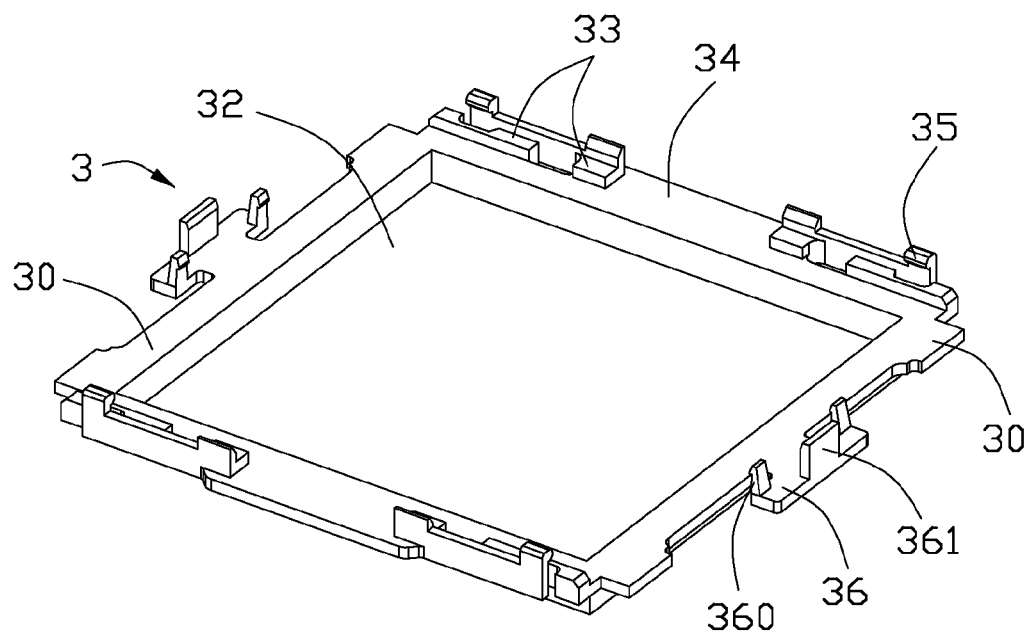
FIG. 3 is a perspective view of a pick-up cap of the electrical connector shown in FIG. 2.
Figure 4:
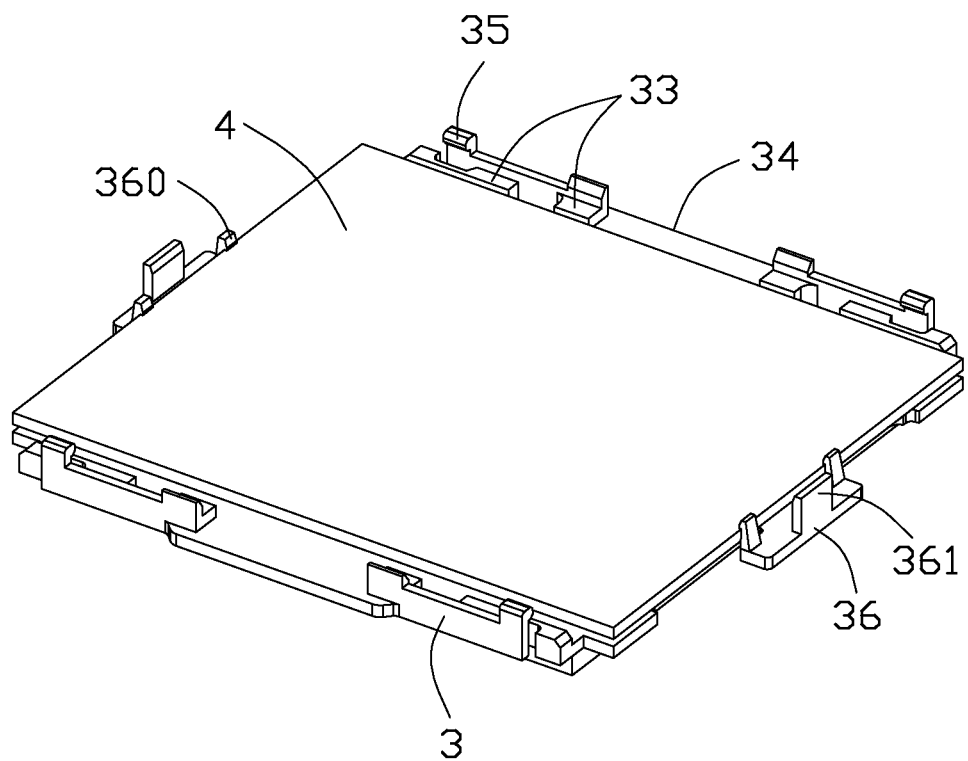
FIG. 4 is an assembled, perspective view of the pick-up cap of the electrical connector and a CPU.

Referring to FIGS. 2 to 4, the pick-up cap 3 made of insulative material has a base 30 and a protruding section 31 protruding upwardly from the base 30 with a smooth top surface 310. An accommodating space 32 is defined by the base 30 and the protruding section 31 for receiving the chip 41 of the CPU 4 therein. The base 3 defines a plurality of positioning blocks 33 extending downwardly therefrom for engaging with sidewalls 401 of the base plate 40 to position the CPU 4 to the pick-up cap 3. Two extending portions 34 extend from two opposite sides of the base 30 and each defines a pair of hooks 35 extending downwardly from two opposite ends thereof. The insulating housing 1 defines a plurality of openings 14 disposed on outer surfaces of the sidewalls 11 and corresponding to the extending portions 34. The hooks 35 engage with the holding slots 110 to assemble the pick-up cap 3 on the insulating housing 1 as shown in FIG. 1.

Figure 6:
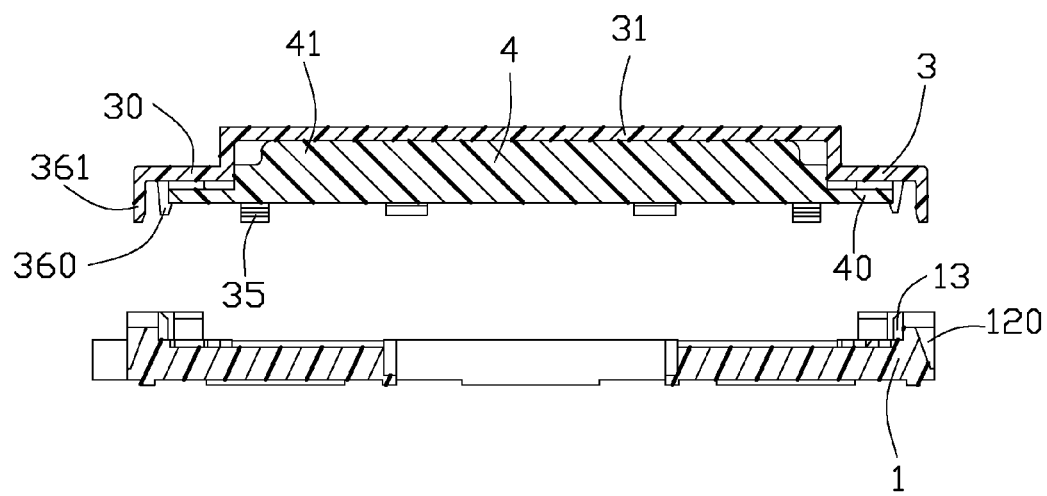
FIG. 6 is a cross-sectional view of the electrical connector and the CPU, showing the CPU is clasped by the pick-up cap without assembling on the insulating housing of the electrical connector.

The base 30 also has two protrusions 36 protruding outwardly along a horizontal direction from the other opposite sides thereof. Each protrusion 36 has a pair of latches 360 extending downwardly therefrom and a releasing arm 361 extending downwardly therefrom. Each releasing arm 361 is disposed between two latches 360 and is deformed outward during sliding into the corresponding ramp arrangement 112 of the insulating housing 1 along the guidance of the oblique surface 1120. During assembling the CPU, the releasing arms 361 clasp the base plate 40 of the CPU 4 to retain the CPU 4 on the pick-up cap 3 for carrying the CPU 4 to the insulating housing 1 as shown in FIG. 6. Please refer to FIGS. 7 and 8, when the releasing arms 361 slide into the ramp arrangements 112 of the insulating housing 1, the releasing arms 361 deflect outwardly along the oblique surface 1120 so that the latches 360 deflect outwardly to separate from the base plate 40 of the CPU 4 for releasing the CPU 4. Then, the CPU can seats on the insulative housing 1. At this time, the pick-up cap 3 can be removed. If further press the pick-up cap 3 downwardly, a top surface 410 of the chip 41 will block the pick-up cap's downwardly movement so as to prevent the hooks 35 engage with the holding slots 110. Thus, the CPU 4 and the pick-up cap 3 can't mount to the insulative housing 1 simultaneously. Furthermore, when removes the pick-up cap 3, the Re-contact of the CPU 4 and the pick-up cap 3 should not cause the CPU to remove from the socket due to a chamfered edge 362 defined on the releasing arm 361.

Figure 7:
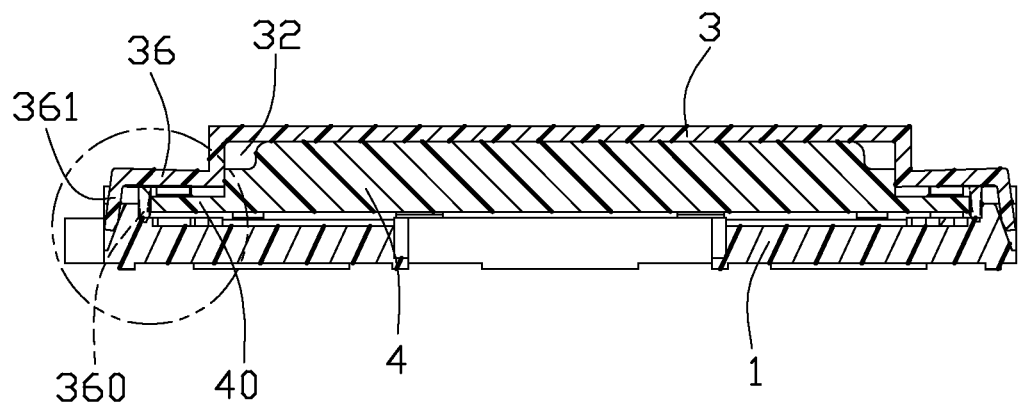
FIG. 7 is a cross-sectional view of the electrical connector and the CPU, taking along line 7-7 in FIG. 1 and showing the pick-up begins to release the CPU.
Figure 8:
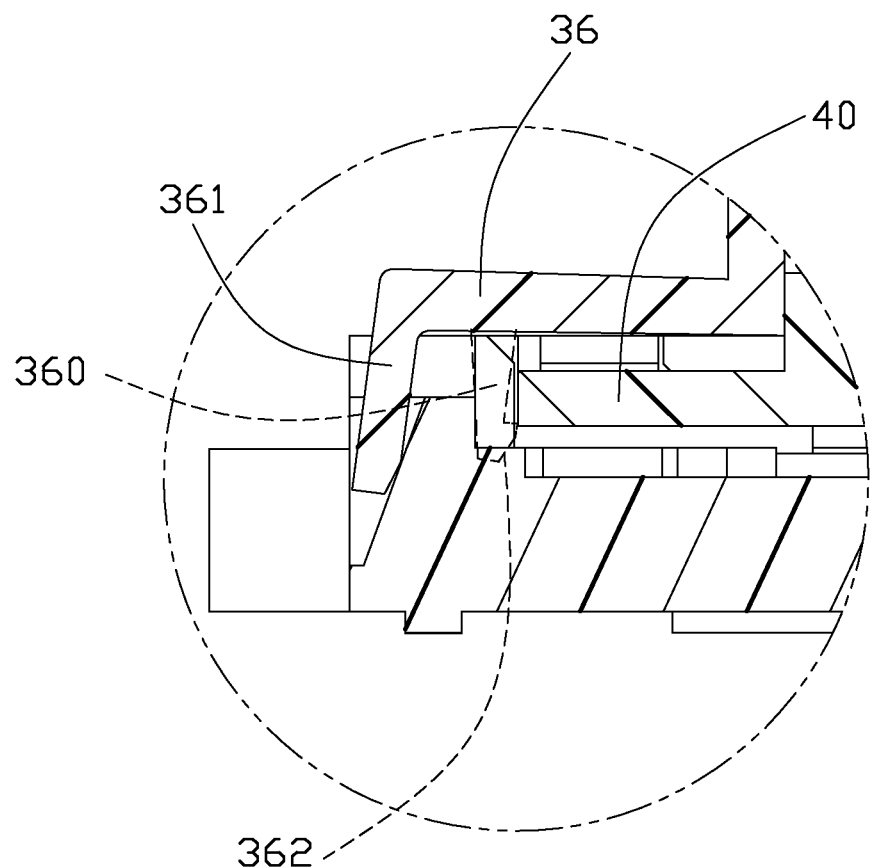
FIG. 8 is an enlarge view of a circular portion shown in FIG. 7.
Figure 9:
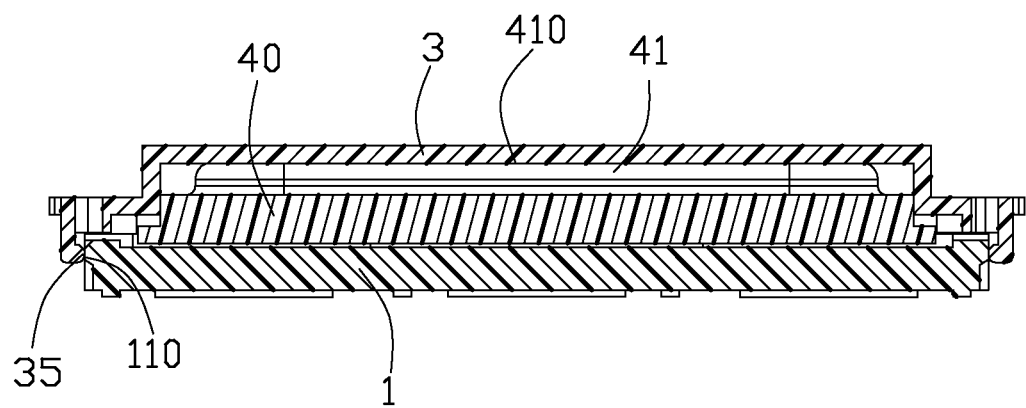
FIG. 9 is a cross-sectional view of the electrical connector and the CPU, showing the CPU is mounted to the insulative housing while the pick-up cap is blocked by the CPU and can not engage with the insulative housing.

In assembly, the terminals 2 are received in the passageways 101 of the insulating housing 1. Referring to FIG. 6, the CPU 4 is positioned and retained on the pick-up cap 3 through the positioning blocks 33 of the pick-up cap 3 engaging with the sidewalls 401 of the base plate 40 of the CPU 4 and the latches 360 of the pick-up cap 3 buckling to bottoms of the base plate 40 of CPU 4. The chip 41 of the CPU 4 is received in the accommodating space 32 of the pick-up cap 3. Referring to FIGS. 7 and 8, the pick-up cap 3 is mounted onto the insulating housing 1 through the hooks 35 engaging with the holding slots 110 of the insulating housing 1, so as to achieve the pick-up cap 3 carrying the CPU 4 onto the insulating housing 1. The releasing arms 361 are deformed outward during sliding into the ramp arrangements 112 of the insulating housing 1 and drive the latches 360 being deflected outward and separated from the base plate 40 of the CPU 4 to release the CPU 4, so as to achieve the pick-up cap 3 carrying and placing the CPU 4 onto the insulating housing 1. The CPU 4 is received in the receiving space 12 of the insulating housing 1 and is positioned onto the insulating housing 1 through the data 13 of the insulating housing 1 abutting against the sidewalls 401 of the base plate 40 of the CPU 4 when the pick-up cap 3 is removed from the insulating housing 1.

The pick-up cap 3 retains the CPU 4 thereon through the latches 360 clasping the base plate 40 of the CPU 4 and carries and places the CPU 4 onto the insulating housing 1 during the pick-up cap 3 is mounted on the insulating housing 1, so as to prevent the terminals 2 from being damaged when the CPU 4 is manually picked and placed onto the insulating housing 1 by operators. The latches 360 of the pick-up cap 3 are drove being deflected outward and separated from the base plate 40 to release the CPU 4 by the releasing arms 361 during the releasing arms 361 sliding into the ramp arrangements 112 of the insulating housing 1. When the pick-up cap 3 is removed from the insulating housing 1, the datum 13 of the insulating housing 1 abuts against the sidewalls 401 of the CPU 4 to position the CPU 4 onto the insulating housing 1 for establishing electrical connection between the CPU 4 and the electrical connector 100.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting a central processing unit (CPU) having a base plate and a chip protruding from the base plate to a printed circuit board (PCB) comprising:
    an insulating housing having a plurality of terminals received therein; and
    a pick-up cap removably assembled to the insulating housing and defining a plurality of hooks extending downwardly from two opposite sides thereof and a plurality of latches extending downwardly from the other two opposite sides thereof;
    wherein the insulating housing has a plurality of holding slots on outer surfaces of two sidewalls thereof, and wherein the hooks engage with the holding slots to mount the pick-up cap onto the insulating housing;
    wherein the pick-up cap has a plurality of releasing arms extending downwardly therefrom, and wherein each releasing arm is disposed between two latches on the same side of the pick-up cap, and wherein the insulating housing defines a plurality of ramp arrangements corresponding to the releasing arms.

2. The electrical connector as claimed in claim 1, wherein the insulating housing defines a plurality of receiving slots corresponding to the latches of the pick-up cap and sunk from top surfaces of the sidewalls thereof, and wherein the latches are received in the receiving slots when the pick-up cap is mounted on the insulating housing.

3. The electrical connector as claimed in claim 1, wherein the pick-up cap has a base and a protruding section extending upwardly from the base, and wherein an accommodating space is defined by the base and the protrusion.

4. The electrical connector as claimed in claim 1, wherein the pick-up cap has a plurality of positioning blocks protruding downwardly therefrom.

5. The electrical connector as claimed in claim 1, wherein the insulating housing defines a receiving space and a plurality of datum extending from the sidewalls thereof toward the receiving space, and wherein the datum abut against sidewalls of the base plate of the CPU to retain and position the CPU in the insulating housing when the pick-up cap is removed from the insulating housing.

6. The electrical connector as claimed in claim 1, wherein the ramp arrangements each has an oblique surface abutting against the corresponding releasing arm of the pick-up cap to make the releasing arms deflected outward during the pick-up cap mounted on the insulating housing.

7. The electrical connector as claimed in claim 6, wherein the pick-up cap has a plurality of protrusions protruding outwardly therefrom in a horizontal direction, and wherein every two latches extend downwardly from two opposite ends of the protrusion, and wherein each releasing arm extend downwardly from a middle of the protrusion, and wherein the releasing arms drive the latches being deflected outward and separated from the CPU to release the CPU during the releasing arms are received in the ramp arrangements of the insulating housing.

8. An electrical connector assembly, comprising:
a CPU (central processing unit);
an electrical connector supporting the CPU, including:
an insulating housing having a plurality of terminals received therein, the insulating housing including a flattened main body and peripheral sidewalls jointly defining a receiving cavity therebetween to receive the CPU, the insulating housing defining a plurality of ramp arrangement disposed on two opposite sidewalls thereof; and
a pick-and-place pick-up cap having a bottom with at least a pair of latches extending therefrom to retain the CPU thereto and a plurality of releasing arms corresponding to the ramp arrangements so as to open the latches for releasing the CPU.

9. The electrical connector assembly as claimed in claim 8, wherein the sidewall of the insulating housing further defines a plurality of receiving slots so as to receive the latches when the pick-up cap start to engage with the insulating housing.

10. The electrical connector assembly as claimed in claim 8, wherein the ramp arrangements each has an inclined surface, and wherein the latches are opened widely when the releasing arms are opened by the inclined surfaces.

11. The electrical connector assembly as claimed in claim 8, wherein each releasing arm is disposed between two latches on the same side of the pick-up cap, and wherein the pick-up cap has a plurality of protrusions protruding outwardly therefrom in a horizontal direction, and wherein every two latches extend downwardly from two opposite ends of the protrusion, and wherein the releasing arms drive the latches being deflected outward and separated from the CPU to release the CPU during the releasing arms are received in the ramp arrangements of the insulating housing.

12. The electrical connector assembly as claimed in claim 8, wherein the insulating housing has a plurality of holding slots on outer surfaces of the other two sidewalls, and wherein the pick-up cap has a plurality of hooks extending downwardly therefrom, and wherein the hooks engage with the holding slots to assemble the pick-up cap on the insulating housing.

13. The electrical connector assembly as claimed in claim 8, wherein the insulating housing defines a plurality of datum extending from the sidewalls thereof toward the receiving space, and wherein the datum abut against sidewalls of the CPU to retain and position the CPU in the insulating housing and a top surface of the CPU blocks the pick-up cap to move downwardly and engage with the insulating housing.

14. The electrical connector assembly as claimed in claim 8, wherein the CPU has a base plate and a chip protruding upwardly from the base plate, and wherein the pick-up cap has a base and a protruding section extending upwardly from the base, and wherein an accommodating space is defined by the base and the protruding section for receiving the chip of the CPU.

15. The electrical connector assembly as claimed in claim 8, wherein the pick-up cap has a plurality of positioning blocks protruding downwardly therefrom to position the CPU thereon.

16. An electrical connector assembly for use with a CPU (Central Process Unit) comprising:
a socket defining an upward facing receiving cavity;
a plurality of contacts disposed in the housing with contacting sections extending into the receiving cavity;
a pick-up cap downwardly mounted to the socket and defining a downwardly facing receiving space dimensioned for snugly receiving the CPU therein, said pick-up cap further including a first latch for locking to the socket, and a second latch for latching the CPU; and
a releasing arm is formed on the pick-up cap around the second latch and is positioned to be adapted to be urged by the socket and successively actuate said second latch to move for releasing the CPU therefrom to allow said CPU to be loaded into the receiving cavity when the pick-up cap containing the CPU in the receiving space is downwardly moved toward the socket.

17. The electrical connector assembly as claimed in claim 16, wherein said releasing arm is positioned outside of the second latch.

18. The electrical connector assembly as claimed in claim 16, wherein a tapered structure is formed on one of the socket and the releasing arm to result in an outward deflection of the releasing arm during downwardly mounting the pick-up cap to the socket.

19. The electrical connector assembly as claimed in claim 16, wherein the second latch is closer to the receiving cavity than the first latch.

* * * * *